United States Patent
Kim et al.

(10) Patent No.: US 9,553,137 B2
(45) Date of Patent: Jan. 24, 2017

(54) DISPLAY DEVICE

(71) Applicant: LG Display Co., Ltd., Seoul (KR)

(72) Inventors: Geun-Young Kim, Gimhae-si (KR);
Du-Hwan Oh, Chungju-si (KR);
Soon-Jae Hwang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 233 days.

(21) Appl. No.: 14/549,923

(22) Filed: Nov. 21, 2014

(65) Prior Publication Data

US 2015/0138467 A1 May 21, 2015

(30) Foreign Application Priority Data

Nov. 21, 2013 (KR) .................. 10-2013-0142131

(51) Int. Cl.
| | |
|---|---|
| H01L 51/52 | (2006.01) |
| G02F 1/1345 | (2006.01) |
| H01L 27/32 | (2006.01) |
| H01L 27/12 | (2006.01) |
| G02F 1/1362 | (2006.01) |

(52) U.S. Cl.
CPC ......... H01L 27/3276 (2013.01); G02F 1/1345 (2013.01); G02F 1/136286 (2013.01); H01L 27/124 (2013.01); *G02F 2001/13629* (2013.01); *H01L 2251/5392* (2013.01)

(58) Field of Classification Search
CPC ............... H01L 27/124; H01L 27/3288; H01L 27/3276; H01L 27/3297; G02F 1/13452; G02F 1/1345; G02F 1/13458
See application file for complete search history.

(56) References Cited

U.S. PATENT DOCUMENTS

| | | | |
|---|---|---|---|
| 8,248,553 B2* | 8/2012 | Park | .................... G02F 1/13452 349/52 |
| 2002/0088984 A1* | 7/2002 | Toda | .................. G02F 1/13452 257/99 |
| 2003/0112382 A1* | 6/2003 | Takahashi | ......... G02F 1/136286 349/43 |
| 2012/0262658 A1 | 10/2012 | Lee et al. | |

(Continued)

FOREIGN PATENT DOCUMENTS

| | | |
|---|---|---|
| CN | 1342917 A | 4/2002 |
| CN | 101477992 A | 7/2009 |

(Continued)

OTHER PUBLICATIONS

State Intellectual Property Office of the People's Republic of China, First Office Action, Chinese Patent Application No. 201410674021.1, fourteen pages.

*Primary Examiner* — Mariceli Santiago
(74) *Attorney, Agent, or Firm* — Fenwick & West LLP

(57) ABSTRACT

A display device includes a substrate, a plurality of first layered link lines spaced apart from each other on the substrate, a first insulating layer on the plurality of first layered link lines, a plurality of second layered link lines spaced apart from each other on the first insulating layer, each second layered link line between neighboring first layered link lines, a second insulating layer on the plurality of second layered link lines, and a plurality of data lines or a plurality of gate lines connected to the plurality of first layered link lines and the plurality of second layered link lines.

6 Claims, 3 Drawing Sheets

(56) References Cited

U.S. PATENT DOCUMENTS

2013/0063406 A1* 3/2013 Nishino .............. G02F 1/13452
345/204
2015/0301372 A1* 10/2015 Mori .................... G02F 1/1339
349/33

FOREIGN PATENT DOCUMENTS

| CN | 102819995 A | 12/2012 |
| CN | 102998820 A | 3/2013 |
| CN | 103293727 A | 9/2013 |
| KR | 10-2010-0124256 A | 11/2010 |

\* cited by examiner

DISPLAY DEVICE

This application claims the benefit of Korean Patent Application No. 10-2013-0142131, filed on Nov. 21, 2013, which is hereby incorporated by reference for all purposes as if fully set forth herein.

BACKGROUND

Technical Field

The present disclosure relates to a display device, and more particularly, to a display device including link lines.

Discussion of the Related Art

With the advancement of information society, demand for display devices in various forms has increased. Recently, various flat panel display devices, such as a liquid crystal display device (LCD), a plasma display panel (PDP), and an organic light emitting diode display device (OLED), have been used.

A display panel of the display device includes a display region to display images, and a non-display region surrounding the display region.

The display region includes gate lines and data lines crossing each other to define pixel regions in a matrix form. Further, power lines to supply a power signal i.e., a power voltage to the pixel regions are formed in the display region.

In case of the LCD, each pixel region includes a switching thin film transistor (TFT), a storage capacitor, and a liquid crystal capacitor. In case of the OLED, each pixel region includes a switching thin film transistor (TFT), a driving TFT, a storage capacitor, and an organic light emitting diode.

Gate drivers and data drivers are connected to the non-display region. A printed circuit board (PCB) is connected to the data drivers.

The PCB supplies a power voltage, control signals and data signals to the data drivers, and the data drivers supply control signals through signal lines (e.g., LOG lines) formed in the non-display region.

Link lines are formed in the non-display region and function to transfer signals to signal lines in the display region.

In other words, the gate driver is connected to the gate lines through respective link lines in the non-display region, and the data driver is connected to the data lines through respective link lines in the non-display region. Further, the data driver is connected to the power lines in the display region through respective link lines.

Accordingly, the gate driver supplies gate signals to the gate lines, and the data driver supplies data signals to the data lines and supplies the power voltage to the power line.

FIG. 1 is a plan view illustrating link lines of a display device according to the related art, and FIG. 2 is a cross-sectional view taken along a line II-II of FIG. 1.

Referring to FIGS. 1 and 2, link lines LL connect a data driver 13 with respective signal lines in the display region, for example, respective data lines DL and power lines. Even though not shown in the drawings, link lines connect a gate driver with respective gate lines.

The data driver 13 is connected to a PCB 11 and is supplied with control signals and data signals from the PCB 11.

Each data driver 11 or gate driver is connected to many link lines LL, and a distance between neighboring link lines LL is much shorter than that between neighboring gate lines or data lines.

Accordingly, there increases possibility that a short-circuit between neighboring link lines LL happens, and product yield is thus reduced.

In other words, when neighboring link lines LL contact each other, interference in data signals applied to the data lines DL happens, and thus images can't be displayed normally.

Referring to FIG. 2, first to fifth link lines 26a to 26e are formed at the same layer. Among these, the neighboring first and second link lines 26a and 26b are in contact, and thus a short-circuit happens.

The contact between the first and second link lines 26a and 26b happens due to a light exposure defect or etching defect when forming the first to fifth link lines 26a to 26e. Even though an insulating layer 28 is formed on the first to fifth link lines 26a to 26e, the short-circuit between the first and second link lines 26a and 26b is not prevented by the insulating layer 28.

The short-circuit causes interference in data signals applied to the data lines DL connected to the first and second link lines 26a and 26b, and images are thus not displayed normally. Accordingly, product yield is thus reduced.

Further, since all link lines 26a to 26e have a single layered structure, a link line, for example, the fourth link line 26d to transfer a power voltage has a high resistance. This causes a drop of the power voltage applied to the display region, and display quality is degraded.

SUMMARY

Accordingly, the present disclosure is directed to a display device that substantially obviates one or more of the problems due to limitations and disadvantages of the related art.

An advantage of the present disclosure is to provide a display device that can prevent a short-circuit between neighboring link lines and reduce a resistance of a link line to transfer a power voltage to a display region.

Additional features and advantages of the disclosure will be set forth in the description which follows, and in part will be apparent from the description, or may be learned by practice of the disclosure. These and other advantages of the disclosure will be realized and attained by the structure particularly pointed out in the written description and claims hereof as well as the appended drawings.

To achieve these and other advantages and in accordance with the purpose of the present disclosure, as embodied and broadly described herein, a display device includes a substrate, a plurality of first layered link lines spaced apart from each other on the substrate, a first insulating layer on the plurality of first layered link lines, a plurality of second layered link lines spaced apart from each other on the first insulating layer, each second layered link line between neighboring first layered link lines, a second insulating layer on the plurality of second layered link lines, and a plurality of data lines or a plurality of gate lines connected to the plurality of first layered link lines and the plurality of second layered link lines.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION OF THE ILLUSTRATED EMBODIMENTS

Reference will now be made in detail to exemplary embodiments, examples of which are illustrated in the accompanying drawings.

Figure 1:
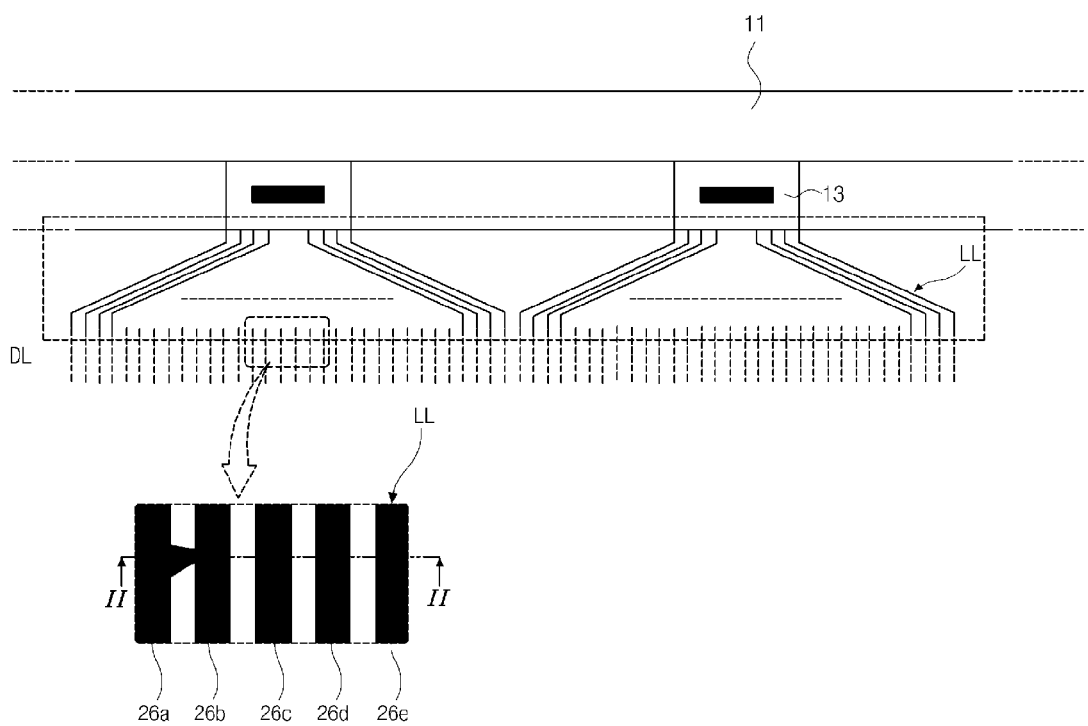
FIG. 1 is a plan view illustrating link lines of a display device according to the related art.
Figure 2:
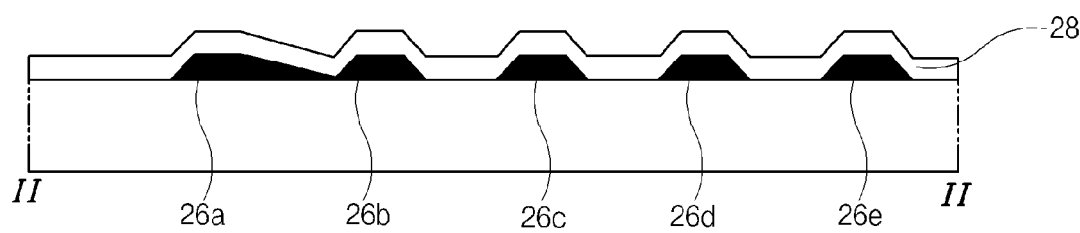
FIG. 2 is a cross-sectional view taken along a line II-II of FIG. 1.
Figure 3:
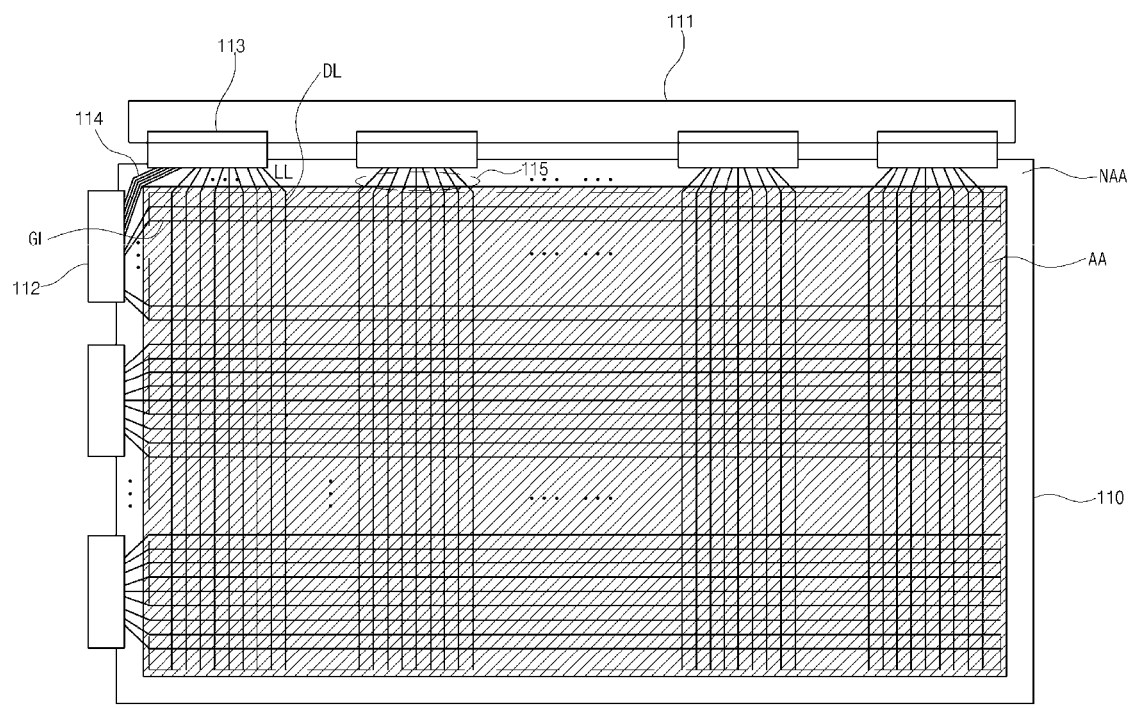
FIG. 3 is a plan view illustrating a display device according to an embodiment of the present disclosure.

FIG. 3 is a plan view illustrating a display device according to an embodiment of the present disclosure.

Referring to FIG. 3, a display panel 110 of the display device includes a display region AA to display images, and a non-display region NAA surrounding the display region AA.

In the display region AA, a plurality of gate lines GL and a plurality of data lines DL cross each other to define a plurality of pixel regions in a matrix form. Further, a plurality of power lines are formed in the display region AA and supply a power voltage to the pixel regions of the display region AA.

The display device of the embodiment can be one of various flat panel display devices.

For example, in case that the display device is an LCD, each pixel region includes a switching TFT, a storage capacitor, and a liquid crystal capacitor. The switching TFT is connected to the corresponding gate and data lines GL and DL, the storage capacitor is connected to the switching TFT, and the liquid crystal layer is connected to the switching TFT and the storage capacitor.

Alternatively, in case that the display device is an OLED, each pixel region includes a switching TFT, a driving TFT, a storage capacitor, and an organic light emitting diode. The switching TFT is connected to the corresponding gate and data lines GL and DL, a gate electrode of the driving TFT is connected to the switching TFT, the organic light emitting diode is connected to a drain electrode of the driving TFT, and the storage capacitor is connected between the gate electrode and a source electrode of the driving TFT. Further, the source electrode of the driving TFT is connected to the power line.

The non-display region NAA is connected to a plurality of gate drivers 112 and a plurality of data drivers 113. The data drivers 113 are connected to a PCB 111 and supplied with a power voltage, control signals and data signals from the PCB 111.

One of the data drivers 113 may supply control signals to the gate drivers 112 through signal lines (e.g., LOG lines) in the non-display region NAA.

Each gate driver 112 supplies gate signals to the gate lines GL through respective link lines LL. Each data driver 113 supplies data signals to the gate lines DL through respective link lines LL. Further, the data driver 113 supplies the power voltage to the power lines through respective link lines LL.

Figure 4:
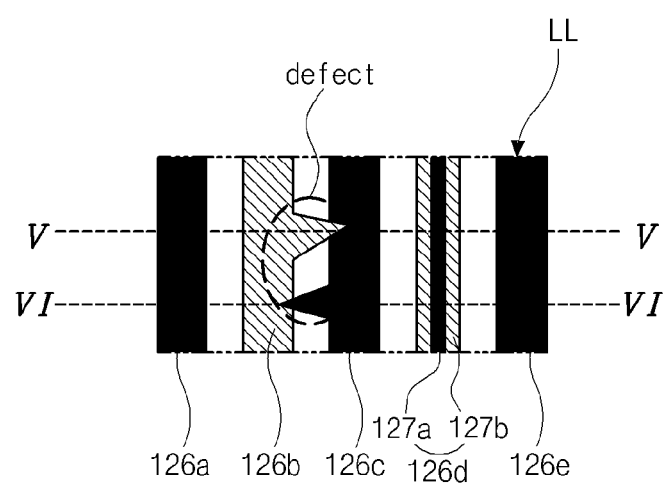
FIG. 4 is a view enlarging a portion "115" of FIG. 3.
Figure 5:
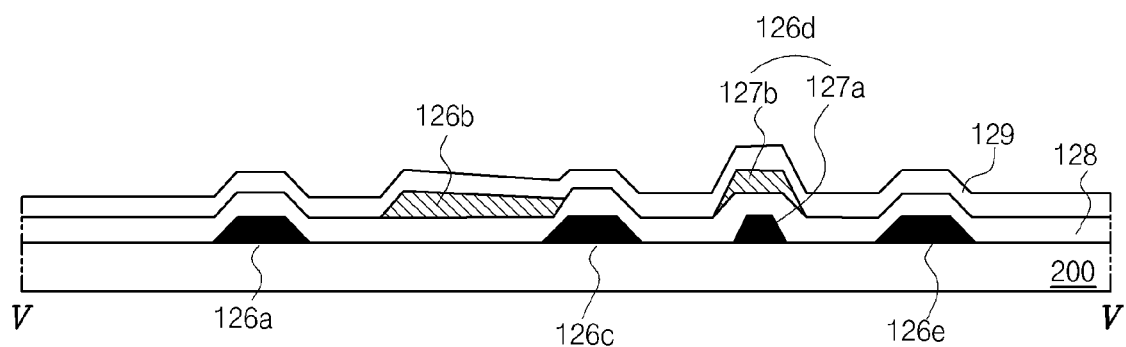
FIGS. 5 and 6 are cross-sectional views taken along lines V-V and VI-VI of FIG. 4, respectively.
Figure 6:
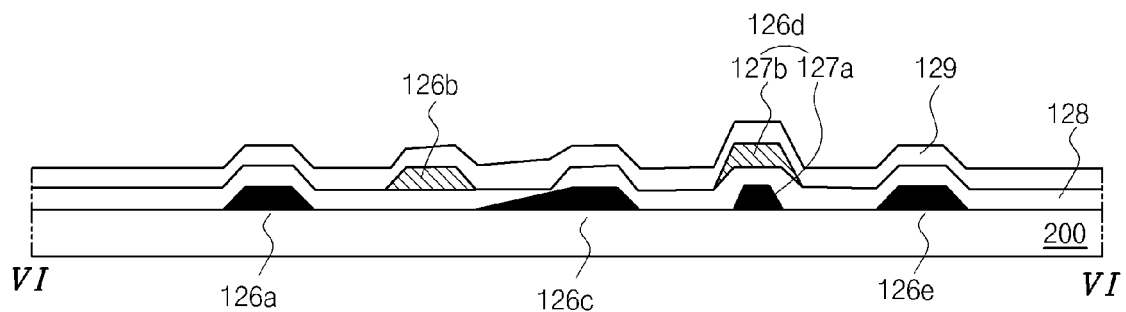

FIG. 4 is a view enlarging a portion "115" of FIG. 3, and FIGS. 5 and 6 are cross-sectional views taken along lines V-V and VI-VI of FIG. 4, respectively.

In FIG. 4, first to fifth link lines 126a to 126e successively arranged along a direction and connected to the data driver 113 are shown. For the purpose of explanation, one of the first to fifth link lines 126a to 126e, for example, the fourth link line 126d is used to transfer a power voltage to the power line in the display area, and the other link lines i.e., the first, second, third and fifth link lines 126a, 126b, 126c and 126e are used to transfer data signals to the respective data lines DL. The fourth link line 126d may be referred to as a power link line.

When forming first to fifth link lines 126a to 126e, due to a light exposure defect or an etching defect, a part of the second link line 126b extends into a region of the third link line 126c, and a part of the third link line 126c extends into a region of the second link line 126b.

Referring to FIGS. 5 and 6, the first link line 126a, the third link line 126c, and the fifth link line 126e are formed at the same layer on the substrate 200 and spaced apart from each other. In other words, the first, third and fifth link lines 126a, 126c and 126e has a singled-layered structure.

A lower line 127a i.e., a first power link line 127a of the fourth link line 126d is formed at the same layer of the first, third and fourth link lines 126a, 126c and 126e.

A first insulating layer 128 is formed on the first, third and fourth link lines 126a, 126c and 126e, and the first power link line 127a of the fourth link line 126d.

The second link line 126b and an upper link line 127b i.e., a second power link line 127b of the fourth link line 126d are formed on the first insulating layer 128.

A second insulating layer 129 is formed on the second link line 126b and the second power link line 127b of the fourth link line 126d.

The first and second insulating layer 128 and 129 each may be formed of an inorganic material, for example, silicon oxide or silicon nitride.

The first and second power link lines 127a and 127b of the fourth link line 126d are electrically connected.

The fourth link line 126d as the power link line has a width narrower than other link lines 126a, 126b, 126c and 126e. Accordingly, the fourth link line 126d does not have a short circuit with neighboring link lines. The link lines 126a, 126b, 126c and 126e preferably have the same width.

Since the fourth link line 126d has two layers, a resistance can be reduced and thus a drop of a power voltage through the fourth link line 126d can be reduced. Further, because of this reduction of the resistance of the fourth link line 126d, the width of the fourth link line 126d can be reduced.

As described above, the link lines in the non-display region substantially includes lower layered link lines i.e., first layered link lines below the first insulating layer 128 and upper layered link lines i.e., second layered link lines on the first insulating layer 128. The second layered link lines between neighboring first layered link lines, and the second layered link lines between neighboring second layered link lines.

In other words, the successive link lines are substantially located alternately on and below the insulating layer 128. Accordingly, neighboring link lines are located at different layers with the insulating layer 128 therebetween.

Thus, even though one of neighboring link lines extends into the region of the other one of the neighboring link lines, a short-circuit between the neighboring link lines can be prevented because the neighboring link lines are insulated from each other.

In other words, referring to FIG. 5, even though the second link line 126b extends into the region of the third link line 126c, because the second and third link lines 126b and 126c are insulated from each other by the first insulating layer 128, a short-circuit between the second and third link lines 126b and 126c can be prevented.

Likewise, referring to FIG. 5, even though the third link line 126c extends into the region of the second link line 126b, because the second and third link lines 126b and 126c are insulated from each other by the first insulating layer 128, a short-circuit between the second and third link lines 126b and 126c can be prevented.

Further, the power link line (i.e., the fourth link line 126d) is formed to have the two-layered structure i.e., the first layered link line (i.e., the first power link line 127a) and the second layered link line (i.e., the second power link line 127b) overlapping each other. Accordingly, the resistance of the power link line can be reduced.

It will be apparent to those skilled in the art that various modifications and variation can be made in the present disclosure without departing from the spirit or scope of the disclosure. Thus, it is intended that the present disclosure cover the modifications and variations of this disclosure provided they come within the scope of the appended claims and their equivalents.

What is claimed is:

1. A display device, comprising:
    a substrate;
    a plurality of first layered link lines, each first layered link line spaced apart from adjacent first layered link lines on the substrate;
    a first insulating layer on the plurality of first layered link lines;
    a plurality of second layered link lines, each second layered link line spaced apart from adjacent second layered link lines on the first insulating layer and between adjacent first layered link lines;
    a second insulating layer on the plurality of second layered link lines; and
    a plurality of data lines or a plurality of gate lines connected to the plurality of first layered link lines and the plurality of second layered link lines.

2. The display device of claim 1, further comprising a power link line including a first power link line and a second power link line overlapping each other, the first power link line at the same layer as the plurality of first layered link lines, the second power link line at the same layer as the plurality of second layered link lines.

3. The display device of claim 2, wherein the power link line has a width less than a width of a layered link line of the plurality of first layered link lines and a width of a layered link line of the plurality of second layered link lines.

4. The display device of claim 1, wherein each of the first and second insulating layers is silicon nitride or silicon oxide.

5. The display device of claim 1, further comprising:
    a plurality of switching thin film transistors, each switching thin film transistor connected to a corresponding gate line of the plurality of gate lines and a corresponding data line of the plurality of data lines;
    a plurality of storage capacitors, each storage capacitor connected to a corresponding switching thin film transistor; and
    a plurality of liquid crystal capacitors, each liquid crystal capacitor connected to a corresponding switching thin film transistor and the corresponding storage capacitor.

6. The display device of claim 1, further comprising:
    a plurality of switching thin film transistors, each switching thin film transistor of the plurality connected to a corresponding gate line and a corresponding data line;
    a plurality of driving thin film transistors and a plurality of storage capacitors, each of which is connected to a corresponding switching thin film transistor; and
    a plurality of organic light emitting diodes, each of which is connected to a corresponding driving thin film transistor.

* * * * *